(12) United States Patent
Quitzk

(10) Patent No.: US 11,165,446 B1
(45) Date of Patent: Nov. 2, 2021

(54) PARALLEL BACKTRACKING IN VITERBI DECODER

(71) Applicant: NXP B.V., Eindhoven (NL)

(72) Inventor: Stefan Quitzk, Freital (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/090,540

(22) Filed: Nov. 5, 2020

(51) Int. Cl.
*H03M 13/41* (2006.01)
*H03M 13/25* (2006.01)

(52) U.S. Cl.
CPC ..... *H03M 13/4169* (2013.01); *H03M 13/256* (2013.01); *H03M 13/41* (2013.01); *H03M 13/4153* (2013.01); *H03M 13/4176* (2013.01); *H03M 13/4192* (2013.01)

(58) Field of Classification Search
CPC ......... H03M 13/4169; H03M 13/4153; H03M 13/4176; H03M 13/4192
See application file for complete search history.

(56) References Cited

U.S. PATENT DOCUMENTS

| | | | | |
|---|---|---|---|---|
| 5,878,092 | A * | 3/1999 | Choi ................. | H03M 13/4169 375/341 |
| 6,591,395 | B1 * | 7/2003 | Tsai .................. | H03M 13/4107 375/341 |
| 6,601,215 | B1 * | 7/2003 | Thurnhofer ....... | H03M 13/4169 714/795 |
| 2004/0177304 | A1 | 9/2004 | Mathew et al. | |
| 2006/0171490 | A1 | 8/2006 | Lee et al. | |
| 2012/0042229 | A1 | 2/2012 | Tang et al. | |
| 2015/0222297 | A1 | 8/2015 | Stanciu et al. | |
| 2018/0048426 | A1 | 2/2018 | Yang et al. | |
| 2018/0267799 | A1 | 9/2018 | Quitzk | |
| 2020/0177166 | A1 | 6/2020 | Quitzk | |

OTHER PUBLICATIONS

Wei Chen, RTL implementation of Viterbi decoder, Master's thesis, Jun. 2, 2006.
Roger Levy, Hidden Markov Model inference with the Viterbi algorithm: a mini-example, Linguistics/CCSE 256 HMM Viterbi mini-example, Winter 2009, 4 pages.
MIT, Viterbi Decoding of Convolutional Codes, Lecture 9, MIT 6.02 Draft Lecture Notes, Fall 2010, last update Oct. 6, 2010, 11 pages, http://web.mit.edu/6.02/www/f2010/handouts/lectures/L9.pdf.
G. David Forney, Jr., The Viterbi Algorithm, Proceedings of the IEEE, vol. 61, No. 3, Mar. 1973.

* cited by examiner

*Primary Examiner* — Joseph D Torres

(57) ABSTRACT

A Viterbi traceback processing method, system, and apparatus are provided wherein a first Viterbi traceback processing operation (MUX 514) is performed on a first survivor path metric (TMV1) by selecting, in response to a back track state (INDEX 0), a first output data bit (Ti1) for the first survivor path metric, wherein a plurality of Viterbi traceback processing operations (MUX 512, 513) are performed on respective portions of an additional survivor path metric (TMV2A, TMV2B) by selecting, in response to a shifted back track state (INDEX 1), candidate data bits (Tn1, Tn2) for the additional survivor path metric, wherein a multiplexer (MUX 518) controlled by the first output data bit selects between the candidate data bits to generate an additional output data bit (Ti2) for the additional survivor path metric such that the Viterbi traceback processing operations are performed in parallel to produce the output data bits.

20 Claims, 4 Drawing Sheets

PARALLEL BACKTRACKING IN VITERBI DECODER

BACKGROUND

Field

The disclosure is directed in general to field of wireless digital communication systems. In one aspect, the disclosure relates generally to a Viterbi decoding method, system, and apparatus.

Description of the Related Art

For modern communications systems which wirelessly transmit data at high rates with minimal error, error correction coding techniques are employed to enhance system performance by coding the transmitted signal so that the correct signal is communicated notwithstanding non-ideal conditions between transmitter and receiver antenna. Convolutional codes are a popular error correction coding choice due to both their capacity and reasonable coding simplicity. For example, convolutional codes are regularly used in various digital communications standards, such as DVB-T (Digital Video Broadcast-Terrestrial), which requires an average bit error rate (BER) of $2 \times 10^{-4}$ for quasi error-free (QEF) operation. Integrated Service Digital Broadcasting-Terrestrial (ISDB-T) is another standard that also employs convolutional codes at the transmitter and may require a similar BER for regular operation.

At a receiver, a receiver may use Viterbi decoder to decode a bitstream that has been encoded using a convolutional code or trellis code. A Viterbi decoder typically includes a branch metric unit (BMU) block, a path metric unit (PMU) block, and a traceback unit (TBU) block. The branch metric unit block calculates branch metrics, which are normed distances between every possible symbol in the code alphabet, and the received symbol. The path metric unit block summarizes branch metrics to get metrics for $2^{K-1}$ paths, where K is the constraint length of the code, one of which can eventually be chosen as optimal. Every clock, the PMU block makes $2^{K-1}$ decisions, each throwing off non-optimal paths. The traceback unit block restores an (almost) maximum-likelihood path from the decisions made by PMU block by accumulating path metrics for up to five times the constraint length (5(K-1)), finding the node with the largest accumulated cost, and beginning traceback from this node. Since Viterbi back tracking generates the decoded hard bits as a result of the Viterbi algorithm bit by bit, each processing step depends on the result bit of the step before, and can therefore not be directly done parallel. Since speed increases in Viterbi back tracking cannot be achieved by using parallel processing techniques, this leads to a processing time limit for back tracking that is independent of the available hardware resources.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
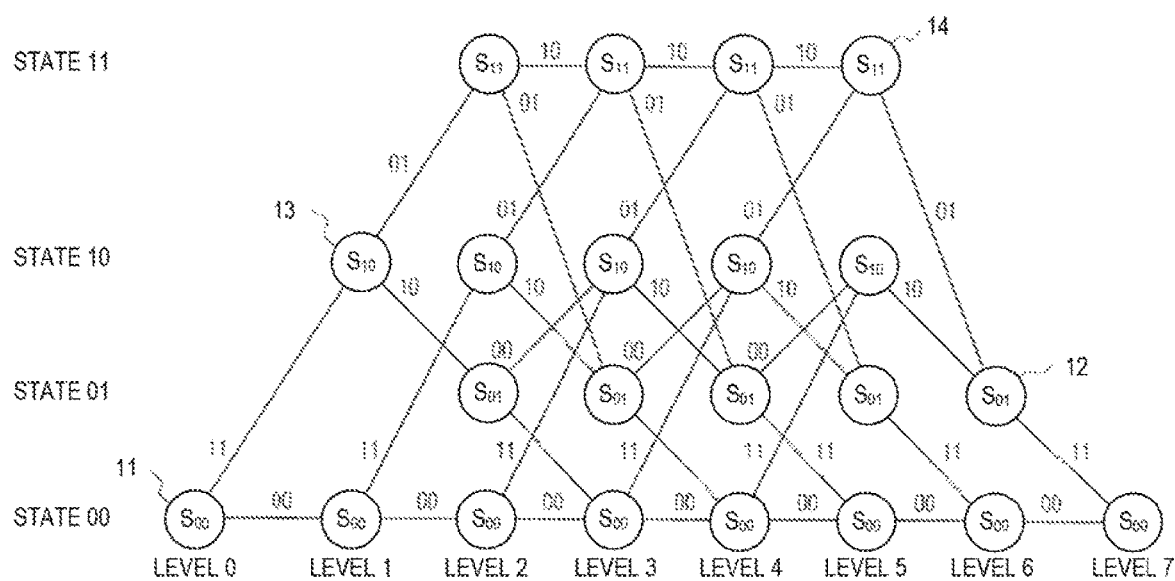
FIG. 1 illustrates a trellis diagram of an exemplary binary convolutional code.

As seen from the foregoing, the existing solutions for performing Viterbi decoding to detect and estimate the transmitted symbols and correctly inferring the bits are extremely difficult at a practical level by virtue of the difficulty balancing the design constraints for providing an efficient and cost effective Viterbi decoder as the error control system with the performance demands for performing high data rate decoding. And with more and more implementation standards using the Viterbi decoding algorithm as the error control system, the ability to provide high performance Viterbi decoding solutions with low silicon cost is constrained by the speed requirements for Viterbi decoders that cannot be solved by spending more hardware resources. Further limitations and disadvantages of conventional processes and technologies will become apparent to one of skill in the art after reviewing the remainder of the present application with reference to the drawings and detailed description which follow.

A Viterbi decoding system, apparatus, and methodology are described for efficiently computing hard bits by using fast parallel backtracking to decode a bitstream that has been encoded using a convolutional code or trellis code. In selected embodiments, a Viterbi decoding algorithm executes at least two backtracking steps in parallel by using both possible inputs (0 or 1) for two processing blocks, thereby enabling the second step to use the output bit of the first step. By using parallel backtracking steps in this way, the result bit of first step and the two result bits of the second steps are ready and may be applied to a simple multiplexer which selects between the two results of the second step under control of the bit of first step, thereby outputting the final result of second step as the multiplexer output. As will be appreciated, the use of parallel backtracking can be further extended by calculating a third step in parallel and so on. The third step computation will require four parallel processing blocks, the fourth step computation will require eight parallel processing blocks, and so on.

As will be appreciated, convolutional codes differ from block codes in that the encoder contains memory and the n encoder outputs at any time unit depend not only on the k inputs but also on m previous input blocks. Therefore, binary convolutional codes may be represented as (n, k, m) notation, where a binary convolutional encoder produces n output bits by combining k input bits and the previous m bits (where m is the memory order of the convolutional code) input bits. An (n, k, m) convolutional code can be implemented with a k-input, n-output linear sequential circuit with input memory m. To decode a convolutional code, a Viterbi decoder is connected to receive the binary convolutional code output sequence of n length, and then reconstruct and output the k input bits of the original input sequence with a high probability. The possibilities of the binary convolutional code may be represented by a code tree that presents every codeword (i.e., code sequence) as a path on the tree. For example, an input sequence of L bits will have a corresponding code tree consisting of (L+m+1) levels, with the leftmost node at level 0 being the origin node and the rightmost nodes at level (L+m) being the terminal nodes. For the first L levels, there may be $2^k$ branches leaving each node. For nodes at levels L through (L+m), only one branch may leave from each node. Each path from the origin node to a terminal node may define a code path and may correspond to a distinct codeword. The codeword may form the output of the binary convolutional encoder for one period of its shift register.

To provide a contextual understanding for selected embodiments of the present disclosure, reference is now made to FIG. 1 which shows a trellis diagram 10 of an exemplary binary convolutional code. As depicted, the code trellis 10 has a structure that may be obtained from a code tree by merging all nodes in the code tree that are in the same state. In the illustrated embodiment, the code trellis 10 includes a series of 8 levels (Level 0 through Level 7) that shows transitions between four states, $S_{00}$ 11, $S_{01}$ 12, $S_{10}$ 13, and $S_{11}$ 14. Due to the merging of nodes in the same state, only one terminal node may remain in a trellis, as all terminal nodes may merge to the same, final state. Similarly, each path from the origin node to the terminal node may represent a distinct codeword. Accordingly, an S-level trellis may have $2^{S-1}$ paths and $2^{S-1}$ codewords. In addition, each transition between states (e.g., from $S_{00}$ 11 to $S_{01}$ 13) in the code trellis 10 may possess a corresponding metric or distance that may be defined as a branch metric. In some embodiments, a Viterbi decoder may calculate the branch metrics for each state transition. In some embodiments, the Viterbi decoder may also store a limited number of paths that possess the shortest distances relative to the received sequence through the combination of branch metrics. These paths stored by the Viterbi decoder may be defined as survivor paths.

In some embodiments, the branch metrics may include a plurality of metrics, such as the normalized distances between a possible reachable symbol in the code alphabet and the received symbol. A hard-decision Viterbi decoder may receive a symbol in the signal and may calculate Hamming distances between the received symbol and the symbols in the code alphabet. For example, a hard-decision Viterbi decoder, upon receiving the symbol $S_{00}$ 11 at level 5, may calculate the Hamming distances between the received symbol $S_{00}$ and each of the symbols $S_{00}$, $S_{01}$ at level 4, respectively. Similarly, a soft-decision Viterbi decoder may substitute the calculation of the Hamming distance for the calculation of a reliability (e.g., probability) value, such as a squared Euclidean distance, for a received signal. In some embodiments, the Viterbi decoder may compare the overall distance between the received sequence and corresponding survivor paths. In such instances, the survivor path with the smallest calculated distance for the entire sequence may be the most reliable.

Figure 2:
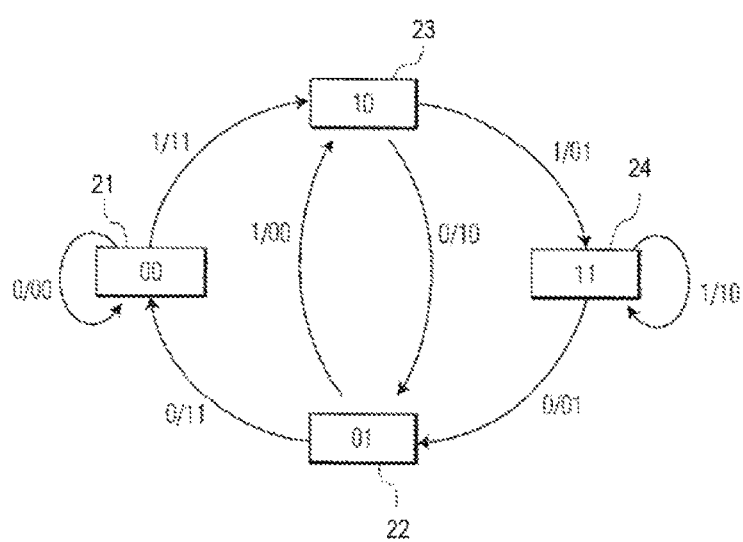
FIG. 2 illustrates a state diagram of a corresponding exemplary binary convolutional code.

Turning now to FIG. 2, there is shown a state diagram 20 of a corresponding exemplary binary convolutional encoder, where the state diagram 20 includes a plurality of possible states $S_{00}$, $S_{01}$, $S_{10}$, $S_{11}$ 21-24 with state transitions between each state which correspond to the state transitions in the trellis 10. Each possible state transition is labeled with the corresponding input and output (i.e., 0/11 represents input bit 0 and output bits 11). As will be discussed in further detail below in relation to FIG. 3, a binary convolutional encoder may be a device component that outputs a binary convolutional codeword. The convolutional codeword that is output from the binary convolutional encoder may be used, for example, as a component in an error correcting code. In some embodiments, the binary convolutional encoder may include a plurality of shift registers and modulo-2 (mod-2) adders. The output bits of the binary convolutional encoder may be modulo-2 additions of selective shift register contents and present input bits, which may result in a code rate of 1/2. More general convolutional codes with a ratio of number of message bits to number of coded bits may be different from 1/2 and may have multiple input and output bits per trellis section. The binary convolutional encoder may also be implemented as a finite state machine (FSM). In such an implementation, the contents of the shift registers may represent the various states 21-24 of the FSM. Therefore, the output of the FSM at a given time may depend on the current state of the machine. For the binary convolutional encoder, each change of state 21-24 may be represented with the input of an input bit and the output of an output bit.

Figure 3:
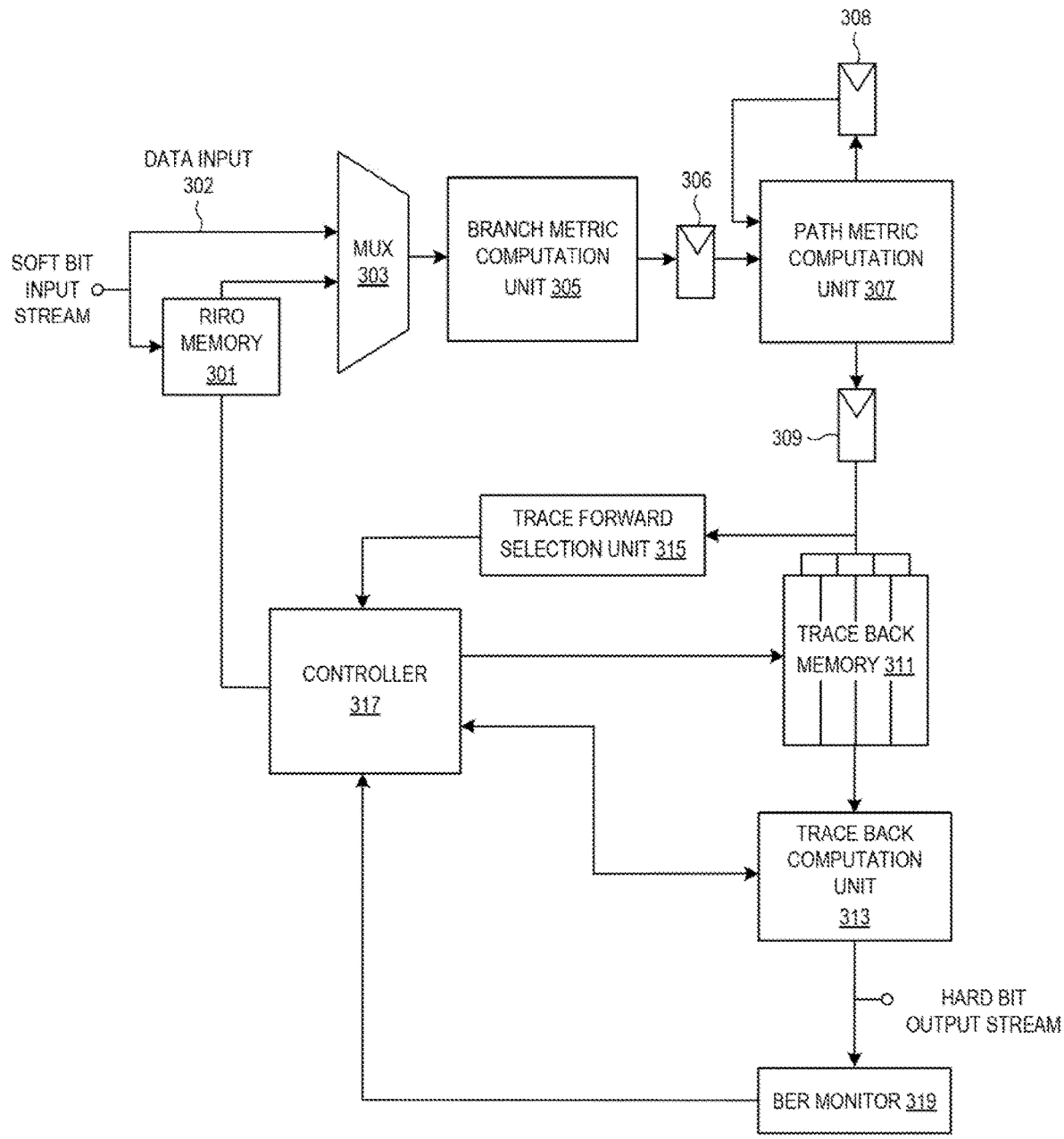
FIG. 3 illustrates a schematic block circuit diagram of an exemplary Viterbi decoder in accordance with selected embodiments of the present disclosure.

To provide additional details for an improved understanding of selected embodiments of the present disclosure, reference is now made to FIG. 3 which illustrates a schematic block circuit diagram of an exemplary Viterbi decoder 300. In operation, the Viterbi decoder 300 may be connected to receive data input 302 as a series of input bits forming a binary convolutional codeword, and may produce a decoded sequence by decoding the incoming bits using the Viterbi algorithm to obtain, with high probability, the optimal survivor path representing the sequence that entered the binary convolutional encoder. As will be appreciated, the Viterbi decoder 300 may be a component of a computer system that decodes bit streams that were encoded with a binary convolutional codeword. The depicted Viterbi decoder 300 includes a run-in run-out (RIRO) memory 301, a multiplexer 303, a Branch Metric Computation Unit (BMCU) 305, a Path Metric Computation Unit (PMCU) 307, a trace back memory (TBM) 311, a trace back computation unit (TBCU) 313, a trace forward and select unit (TFSU) 315, and a controller 317. In selected embodiments, the Viterbi decoder 300 may include one or more storage registers 306, 308, 309 and a bit error rate (BER) monitor 319. In other embodiments, one or more of the components, such as the RIRO memory 301 and/or the TBM 311 may be separate or external to the Viterbi decoder 300. As will be appreciated, the depicted Viterbi decoder 300 illustrates a functional diagram representing an example embodiment, but other embodiments may be implemented with different or additional hardware to achieve substantially the same functionality as that described and illustrated herein.

The input data 302 may be connected through the multiplexer 303 for input to the Branch Metric Computation Unit (BMCU) 305 to provide a series of input bits, starting with the terminal bit from a transmission or storage channel. At the BMCU 305, the input bits are processed to calculate the corresponding branch metrics from these inputs, such as by computes four possible branch metrics Euclidean distance, which are 00, 01, 10, and 11. In selected embodiments, the branch metrics may be defined as a normalized distance between nodes in the code trellis 10. For example, when the Viterbi decoder 300 is a hard-decision Viterbi decoder, the BMCU 305 may calculate Hamming distances for the 11 and 00 transitions between the stage 7 and stage 6 (shown in FIG. 1) from state $S_{00}$ to states $S_{01}$ and $S_{00}$, respectively. The branch metrics may therefore represent the cost of traversing along a specific branch between needs in the code trellis 10. The hard-decision Viterbi decoder may receive the bitstream on its input and may use the calculated Hamming distance as its branch metric. Alternatively, when the Viterbi decoder 300 is a soft-decision Viterbi decoder that receives a bitstream 302 and produces branch metrics containing information regarding the reliability of each of the received symbols, the BMCU 305 may be configured to calculate the squared Euclidean distance as the branch metric. In selected embodiments, the BMCU 305 or other components in the Viterbi decoder 300 may use the relative Euclidean distances to determine the relative reliabilities of a plurality of survivor paths. In selected embodiments, the BMCU 305 may calculate new branch metrics for each input bit during every clock cycle since, during each clock cycle, the BMCU 305 may receive a new input bit that represents a new level in the trellis.

The computed branch metrics may be stored in a memory storage register 306 and/or provided directly to the Path Metric Computation Unit (PMCU) 307 which may be include a series of add-compare-select (ACS) units that receive the branch metrics produced by the BMCU 305 and the stored state metrics values retrieved from the path metric register 308. In selected embodiments, the ACS units in the PMCU 307 are configured to add each incoming branch metric of the state to the corresponding state metric, to compare the two results to select a bigger one, and to update the state metric storage 308 with the selected value, thereby recursively accumulating the branch metrics as path metrics for a plurality of possible paths through the code trellis 10. The configuration of the plurality of ACS units may be based on the arrangement of the code trellis 10 representing the received convolutional codeword. PMCU 307 may then compare the accumulated path metrics with each other for a given level in the trellis. In some embodiments, the PMCU 307 may also make a decision by selecting the most likely state transition that would constitute an applicable survivor path, thereby generating a plurality of decision bits corresponding to the chosen state transition. Path metrics, also known as state metrics, may collect the total minimum cost of arriving at a specific state from an initial state, which may be in the form of a sum of a series of connected branch metrics. Such a cost function may be in the form of a function based on the decreasing likelihood of the path between the initial state and the specific state. When constructing the path metric using the trace back method, the "initial state" may be the last signal in a decoded sequence, with the "specific state" being the oldest state saved in the survivor path. A commonly-used function in implementation for such a function of likelihood may be, for example, the logarithmic or log-likelihood functions.

In selected embodiments, the ACS units in the PMCU 307 may be connected and configured to update the path metrics recursively by adding branch metrics to the path metrics of the previous time instant. In some embodiments, the PMCU 307 may store the previous iterations of the path metric in at least one register, such as the path metric register 308. In such instances, the PMCU 307 may retrieve the path metric from the path metric register 308 and the branch metric from the branch metric register 306, appending the branch metric to the retrieved path metric. In some embodiments, during every clock cycle, the PMCU 307 may update the plurality of path metrics produced by the BMCU 305. For example, after receiving the branch metrics for stage 5, the PMCU 307 may append the branch metrics of the new stage to a stored path metric. For example, if the PMCU 307 previously decided on the "11" branch from the terminal state, the PMCU 307 may add metrics associated with the "01" and "10" branches, respectively, to the stored path metric.

In some embodiments, the PMCU 307 may then compare the path metric outcomes of the two appended paths, such as by conducting a subtraction of the two candidate path metrics, with the most significant bit of the difference pointing to a larger one of the two. For example, if the "10" transition has a smaller metrics than the "01" transition, the path metric containing the "10" transition will be smaller, as the two paths may be identical, except for the appended branch metrics. After performing the subtraction from the path metric with the "01" transition, the "01" path may contain the most significant bit. This may serve as a signal to indicate that the PMCU 307 should select the path metric containing the "10" transition, as it is the smaller. Alternatively, the trace back computation unit 313 may make the comparison(s) through a similar method.

The calculated path metrics from the PMCU 307 may be stored in a memory storage register 309 and/or provided directly to the trace back memory (TBM) 311 which stores the survivor path of each state selected by the PMCU 307 for use by the TBCU 313 to build the complete series of survivor paths. In selected embodiments, the TBM 311 may also produce surviving local bit information. In such instances, the TBCU 313 may receive the surviving local bit information from the TBM 311 and may construct a series of survivor paths, including an optimal survivor path from the path metrics constructed by the PMCU 307 and the surviving local bit information stored in the TBM 311. The TBM 311 may use a first-in-last-out (FILO) buffer.

Though theoretically requiring the entire input sequence, in many embodiments, paths through the code trellis 10 may generally merge to a common survivor path after a number of iterations. However, the decoding may still be unique up to the point that multiple paths merge to the terminal state. The depth at which all the survivor paths merge with high probability may be defined as the survivor path length. In some embodiments, the TBM 311 may be only be large enough to store the decoded bits up to the number of survivor paths. In some embodiments, the TBM 311 may receive from the PMCU 307 a plurality of trace back bits to indicate a chosen path for each of the stored survivor paths. The survivor paths constructed by the TBCU 313 may therefore store a collection of the received trace back bits in sequence. In some embodiments, the TBM 311 may receive the trace back bits from at least one decision bit register, which may receive the trace back bits outputted from the PMCU 307 during a given clock cycle.

For example, the Viterbi decoder 300 may use the trace back method of the Viterbi algorithm to create the decoded bit sequence from the incoming input bits that comprise the convolutional code. When using the trace back method, for all of the $2^m$ states, the Viterbi algorithm may store a trace back bit. The trace back bit may indicate which of two incoming edges was selected by the PMCU 307. Accordingly, the TBCU 313 may need to construct survivor paths of $2^m$ length. The Viterbi may build the survivor paths by recursively constructing the possible symbols from a specified time k to k-1, for example.

The survivor paths of the trace back method may eventually merge as more bits are added, with all paths merging to the same value. In some instances, the survivor paths may merge to a common symbol to a state later in the code trellis 10. For example, a plurality of survivor paths being constructed from the receipt of a bit at level 7 may merge to a common symbol by level 0. In some embodiments, once multiple survivor paths merge to a common symbol, they may not diverge again during an earlier stage in the trellis.

If, for example, two survivor paths merge at level 3, they will then share common values at levels 0-2.

Trace back computation unit (TBCU) 313 may construct a series of survivor paths based on the path metrics generated by the PMCU 307 to find the most likely path from the last state to the first state in the survivor path metric, and then generate the decoded output sequence. In some embodiments, the TBCU 313 may also select the path with the minimum overall value for its path metrics. When making a selection decision during a given clock cycle, the TBCU 313 may discard old values in each of the survivor paths. In some embodiments, the TBCU 313 may also discard non-optimal paths and output the chosen path as the optimal path. For example, when the "10" branch is the smaller metric, the TBCU 313 may construct a survivor path using the "10" branch metric received from the PMCU 307. In some embodiments, the TBCU 313 may also select its associated path as the optimal survivor path. The smaller path metric of the two is selected to be the new path metric to construct the survivor path for a given state. When all the input data is processed through the BMCU 305, the PMCU 307, and the TBCU 313, the complete minimum path metric outputted may be the complete optimal survivor path that represents the best-likelihood estimation of the input sequence into the binary convolutional encoder. In some embodiments, for example, the minimum path metric may have the smallest value for its path metric relative to the received sequence. Recursively tracing backwards along the code trellis 10 of the state transitions used by the binary convolutional encoder, the optimal survivor path chosen by the TBCU 313 may represent the most likely sequence of transmitted data as it entered the binary convolutional encoder. In some embodiments, the TBCU 313 may also send information back to other components of the Viterbi decoder 300, such as address information to the TBM 311 or the PMCU 307. In some embodiments, the TBCU 313 may also relay configuration information sent from the controller 317.

RIRO memory 301 may be a circuit or device, such as a random-access memory (RAM) circuit, that stores state information received from the data input. In some embodiments, the RIRO memory 301 may store a small portion of the bitstream. In some embodiments, the Viterbi decoder 300 may process a received bitstream twice. In such instances, the Viterbi decoder 300 may retrieve the portion of the bitstream that needs further processing from the RIRO memory 301 instead of receiving the entire bitstream again from the transmission or storage channel through which it initially received the message. In some embodiments, the size of the RIRO memory 301 may be in proportion with the size of the binary convolutional codeword. For example, if the entire binary convolutional codeword is a defined block size, the size of the RIRO memory may be equal to the sum of the header and tail of the binary convolutional codeword.

Registers 306, 308, 309 may be one or more memory units that store data outputted from various computation units. For example, the branch metric register 306 may receive and store branch metric values outputted from the BMCU 305. Similarly, the path metric register 308 may store the path metric values outputted from the PMCU 307. Decision bit register 309 may also receive the trace back bits outputted from the PMCU 307 before the additional trace back bits are appended to the path metrics stored in the TBM 311 and/or the trace forward and select unit (TFSU) 315.

In selected embodiments, the trace forward and select unit (TFSU) 315 may be used when the Viterbi decoder implements a hybrid of the trace back method and the register exchange method. In such instances, the TFSU 315 may be used along with the TBM 311 to predict the possible state sequence, which may be used to increase the speed of the calculations involved in the trace back method.

Controller 317 may receive information from various components in the Viterbi decoder 300 and may modify the configuration of various component devices in the Viterbi decoder 300 based on the received information and/or the chosen standard currently in use by the Viterbi decoder 300. In some embodiments, the controller 317 may control and/or modify the RIRO memory 301, the multiplexer 303, the BMCU 305, the registers 306, 308, 309, the PMCU 307, the TBM 311, the TBCU 313, the TFSU 315, and/or the BER monitor 319 through one or more distinct control signals. For example, the controller 317 may modify one or more of the components based on a defined standard. A communication standard, such as those used by XM, HD-radio AM, UMTS, or 802.11g may use different convolutional codewords and thus require different configurations of one or more components in the Viterbi decoder 300 to work effectively and efficiently. Some of the configuration changes may be the result of differences in code rate, constraint length, and/or the code generator polynomial used by a binary convolutional encoder to construct the convolutional codeword.

Bit error rate (BER) monitor 319 may be included in some embodiments of the Viterbi decoder 300 to compare the optimal survivor path chosen by the TBCU 313 and the received sequence. In some embodiments, the BER monitor 319 may make its comparison by comparing the difference between the optimal survivor path and the received sequence against a defined threshold. In some embodiments, the BER monitor 319 may use a defined threshold set by the controller 317 that may be based on the standard currently in use. When the calculated difference is greater than the defined threshold, the BER monitor 319 may trigger an alarm or interrupt.

Figure 4:
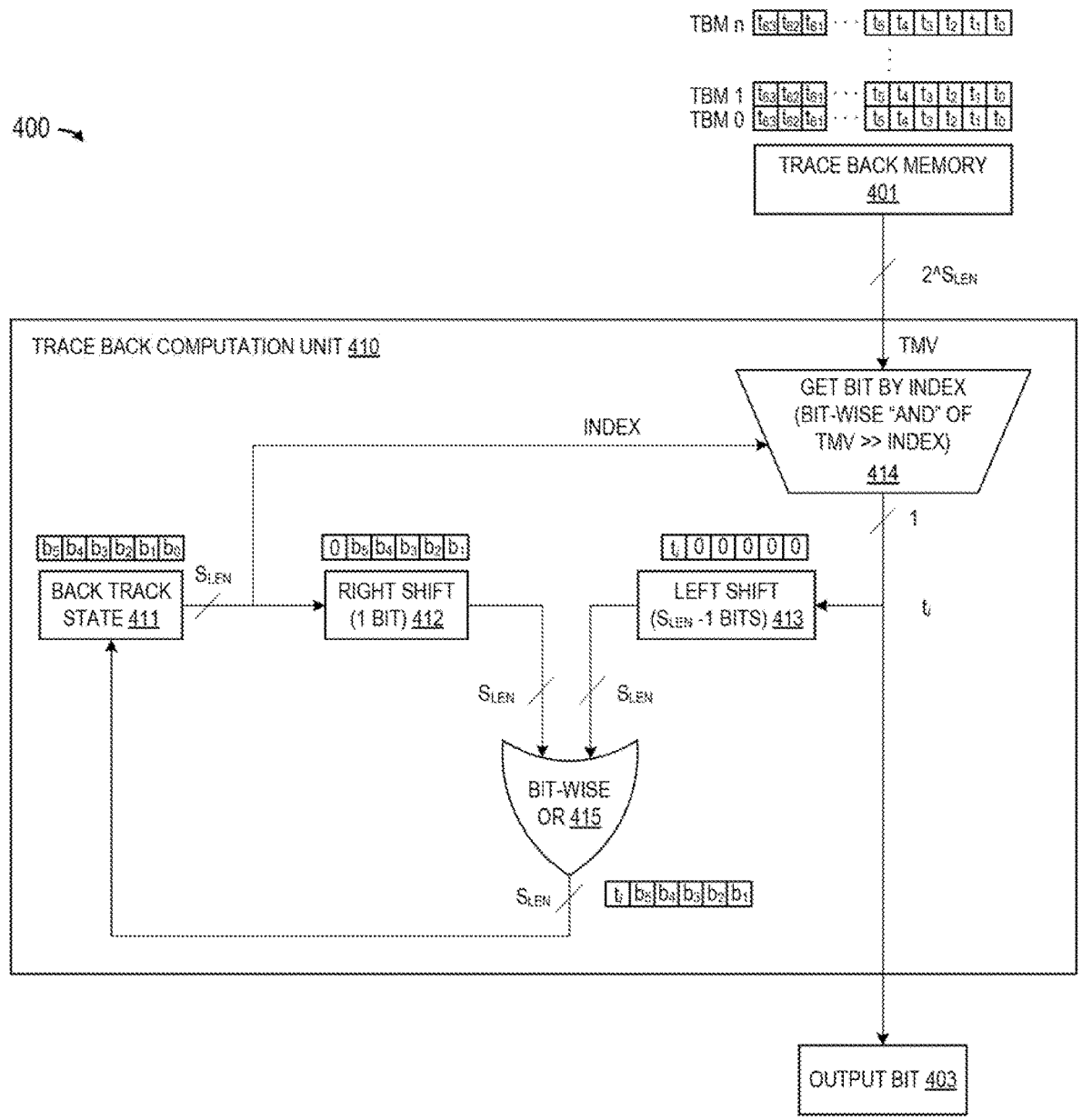
FIG. 4 illustrates a simplified schematic block diagram of the trace back memory and computational logic and processing used to implement Viterbi back tracking operations.

To provide additional details for an improved understanding of selected embodiments of the present disclosure, reference is now made to FIG. 4 which illustrates a simplified schematic block diagram 400 of a trace back memory 401 and trace back computational logic and processing 410 which are used to implement Viterbi back tracking operations. As depicted, the trace back memory 401 stores the survivor path of each state selected by the PMCU 307 during forward processing, where $S_{LEN}$ is the length of the state ("back track state") in the number of bits equaling the length of the convolutional code polynomial k minus 1 (e.g., $S_{LEN}$=k-1). To this end, the trace back memory 401 may be constructed as an array of $2^{\hat{}}S_{LEN}$ rows and n columns (e.g., TBM0-TBMn), where each row has a length of the input data, and where each column has $2^{\hat{}}S_{LEN}$ one-bit field entries (e.g., $t_0$-$t_{63}$ in the case of a k=7 trellis code 10). In this arrangement, the PMCU 307 may write the n columns of data to the trace back memory 401 during forward processing, and the TBCU 313 may read one or more columns of data from the trace back memory 401 during each step of traceback processing.

When the code trellis 10 is finished and stored in the trace back memory 401, trace back computation logic unit 410 is connected to sequentially read one or more columns from the trace back memory 401 when searching the most likely path from the final state which is (e.g., State 00) to the beginning state (e.g., State 00) in the code trellis 10. To this end, the trace back computation logic unit 410 may include an input multiplex selection circuit 414 which is connected to receive a selected input column TMV (e.g., TBM 0) from the trace back memory 401 and to select an output $t_i$ from the $2^\wedge S_{LEN}$ one-bit fields of the selected input column TMV in response to a selection control signal (e.g., INDEX). In selected embodiments, the input multiplex selection circuit 414 may be implemented with a "get bit by index" function to select the output $t_i$ as the multiplexer output bit in response to the selection control signal INDEX. While any suitable multiplexing selection circuit may be used, in selected embodiments, the "get bit by index" function may be implemented by performing a bit-wise AND of a constant 1 value and the selected input column TMV that is right shifted by the selection control signal INDEX, thereby generating a one-bit output $t_i$. At each clock cycle, the selected output $t_i$ of the input multiplex selection circuit 414 is stored or provided as the output bit 403, and is also connected to a left shift circuit 413 which is connected and configured to provide a first input to a combinatorial logic circuit 415. As depicted, the left shift circuit 413 may be configured to shift the output $t_i$ from the input multiplex selection circuit 414 to the left by ($S_{LEN}$-1) bits when generating the first input to the combinatorial logic circuit 415.

The trace back computation logic unit 410 may also include a first memory storage or register 411 which is connected to store a back track state generated by the combinatorial logic circuit 415. As depicted, the first memory storage/register 411 is connected to a right shift circuit 412 which is connected and configured to provide a second input to the combinatorial logic circuit 415, and is also connected to the input multiplex selection circuit 414 to provide the selection control signal INDEX for controlling the selection of the output $t_i$ from the $2^\wedge S_{LEN}$ one-bit fields of the selected input column TMV. As depicted, the right shift circuit 412 may be configured to shift the back track state from the first memory storage/register 411 to the right by one bit when generating the second input to the combinatorial logic circuit 415.

As depicted, the combinatorial logic circuit 415 may be connected and configured to receive and combine the first and second inputs with a predetermined combinatorial logic function, such as a bit-wise OR logic function. In other embodiments, the predetermined combinatorial logic function may be an "arithmetic add" function. More generally, the combinatorial logic circuit 415 may be implemented without logic by simply concatenating one bit from the selected TMV and $S_{LEN}$-1 bits from back track state 411. In any case, the first and second inputs to the combinatorial logic circuit 415 each have a specified width $S_{LEN}$, and the output from the combinatorial logic circuit 415 also has the specified width $S_{LEN}$ for storage in the first memory storage/register 411.

To illustrate the operation of the trace back computation logic unit 410, the current back track state that is stored in the first memory storage/register 411 with $S_{LEN}$ bits (e.g., b5/b4/b3/b2/b1/b0) is output to the right shift circuit 412 and is also provided to the input multiplex selection circuit 414 as a selection control signal (e.g., INDEX). In addition, an output $t_i$ selected from a selected input column TMV (e.g., $t_0/t_1/\ldots t_{63}$) by the input multiplex selection circuit 414 is output to the left shift circuit 413 and is also provided to the output bit storage 403. At a given clock cycle, the stored back track state is shifted to the right by one bit at the right shift circuit 412, thereby generating a right-shifted back tract state (e.g., 0/b5/b4/b3/b2/b1) for input to the combinatorial logic circuit 415. Simultaneously, the selected output $t_i$ is shifted to the left by ($S_{LEN}$-1) bits at the left shift circuit 413, thereby generating a left-shifted output $t_i$ (e.g., $t_i/0/0/0/0$) for input to the combinatorial logic circuit 415 where it is combined with the right-shifted back tract state to generate the previous back track state (e.g., $t_0/b5/b4/b3/b2/b1$) for storage at the first memory storage/register 411. In this way, the trace back computation logic unit 410, at each clock cycle, right shifts one bit of the binary back track state number and adds one bit from the survivor path metric to compute the previous state. By doing this, the most likely back track path through the code trellis 10 is found.

Figure 5:
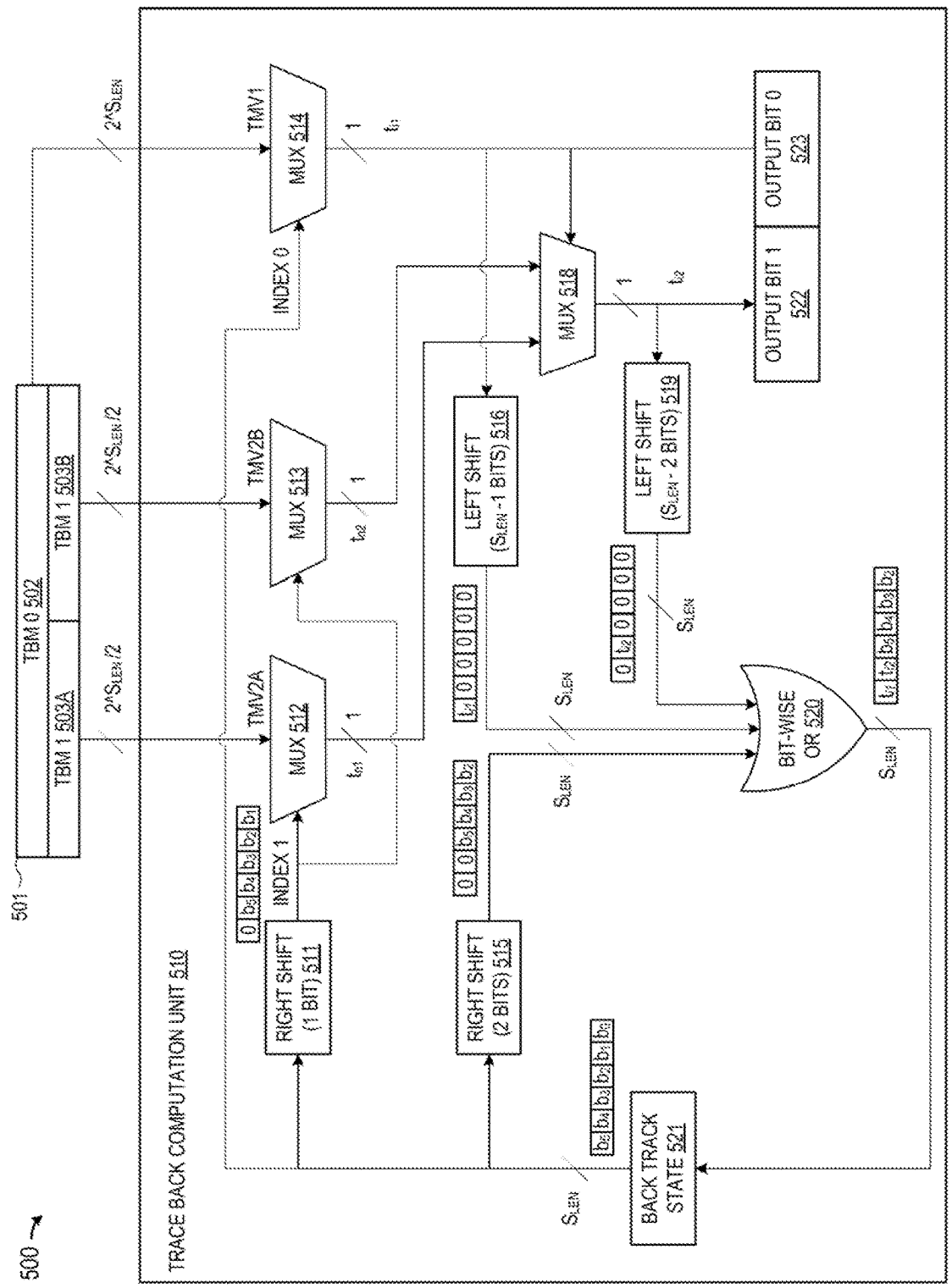
FIG. 5 illustrates a simplified schematic block diagram of the trace back memory and computational logic and processing used to implement Viterbi back tracking operations by computing two bits in parallel in accordance with selected embodiments of the present disclosure.

To provide additional details for an improved understanding of selected embodiments of the present disclosure, reference is now made to FIG. 5 which illustrates a simplified schematic block diagram 500 of a trace back memory 501 and trace back computation logic unit 510 which are used to implement Viterbi back tracking operations by computing two or more bit processing steps in parallel. In the disclosed approach, first and second Viterbi back tracking processing steps are executed in parallel by computing two possible input scenarios for the second back tracking processing step and by using the result of the first back tracking processing step to select or choose between the two possible input scenarios computed for the second back tracking processing step. As disclosed herein, a simple multiplexer can be used to generate a final result of second back tracking processing step by selecting between two results of the second back tracking processing step in response to a selection control signal that is computed as a result of the first back track processing step. This idea can be further extended by calculating a third back tracking processing step in parallel, and so on. To calculate a third back tracking processing step, four parallel processing blocks will be required. Similarly, the computation of a fourth back tracking processing steep will require eight parallel processing blocks.

In the depicted trace back memory 501, the survivor path metric states computed for the code trellis 10 during forward processing are stored as a plurality of n memory columns (e.g., TBM0, TMB1, $TBM_n$) and $2^\wedge S_{LEN}$ rows, where each row has a length of the input data, and where each column has $2^\wedge S_{LEN}$ one-bit field entries. For example, a first trace back memory column TBM0 502 in the trace back memory 501 is used by the trace back computation unit 510 to compute a first back tracking processing step. In addition, a second trace back memory column TBM1 503A/B in the trace back memory 501 is used by the trace back computation unit 510 to compute a second back tracking processing step.

To process the first trace back memory column TBM0 502 stored in the trace back memory 501, the trace back computation unit 510 includes an input multiplex selection circuit 514, back track state memory storage or register 521, right shift circuit 515, left shift circuit 516, and combinatorial logic circuit 520 which are connected and configured to implement Viterbi back tracking operations on the first trace back memory column TBM0 502. Similar to the operation shown in FIG. 4, the input multiplex selection circuit 514 is connected to receive the first trace back memory column TBM0 502 from the trace back memory 501 as a first selected input column TMV1, and to select a first output $t_{i1}$ from the $2^\wedge S_{LEN}$ one-bit fields of the selected input column TMV1 in response to a first selection control signal (e.g., INDEX0) provided by the back track state memory storage/register 521. In selected embodiments, the input multiplex selection circuit 514 may implement a "get bit by index" circuit to select the first output $t_{i1}$ as the multiplexer output bit in response to the first selection control signal INDEX0, though any suitable multiplexing selection circuit may be used. As depicted, the input multiplex selection circuit 514 generates the first output $t_{i1}$ as output bit 0 523 and that is provided to the left shift circuit 516. At each clock cycle, the first output $t_{i1}$ from the input multiplex selection circuit 514 is input to a left shift circuit 516 and, simultaneously, the back track state from the memory storage or register 521 is input to the right shift circuit 515. At the left shift circuit 516, the first output $t_{i1}$ is shifted to the left by ($S_{LEN}$-1) bits to generate a first input to the combinatorial logic circuit 520, while the right shift circuit 515 shifts the back track state stored in the back track state memory storage/register 521 to the right by two bits to generate a second input to the combinatorial logic circuit 520.

To simultaneously process the second trace back memory column TBM1 503A/B stored in the trace back memory 501, the trace back computation unit 510 also includes a right shift circuit 511, first and second input multiplex selection circuits 512, 513, multiplexer circuit 518, and left shift circuit 519 which are connected and configured to generate a third input to the combinatorial logic circuit 520. As depicted, the right shift circuit 511 is connected to receive the back track state from the memory storage or register 521 where it is shifted to the right by one bit to generate a second selection control signal INDEX1 that is provided to the first and second input multiplex selection circuits 512, 513. Similar to the operation shown in FIG. 4, each of the first and second input multiplex selection circuits 512, 513 is connected to receive half of the second trace back memory column TBM1 503A, 503B from the trace back memory 501 as part of a second selected input column TMV2A, TMV2B. In this arrangement, the first input multiplex selection circuit 512 selects a first interim output $t_{n1}$ from the $2^{\hat{}}S_{LEN}/2$ one-bit fields of the selected input column TMV2A in response to the second selection control signal (e.g., INDEX1), and the second input multiplex selection circuit 513 selects a second interim output $t_{n2}$ from the $2^{\hat{}}S_{LEN}/2$ one-bit fields of the selected input column TMV2B in response to the second selection control signal (e.g., INDEX1). In selected embodiments, each of the first and second input multiplex selection circuits 512, 513 may implement a "get bit by index" circuit to select the interim outputs $t_{n1}$, $t_{n2}$ as the multiplexer output bit in response to the second selection control signal INDEX1, though any suitable multiplexing selection circuit may be used. However implemented, the effective computational result of the first and second input multiplex selection circuits 512, 513 is to simultaneously execute two computations of the second trace back memory column TBM1 in parallel, but in order to choose the correct computation, the computation result from the first second trace back memory column TBM0 is needed.

In order to meet the requirement for using a first state metric computation to choose between two possible second state metric computations, the interim outputs $t_{n1}$, $t_{n2}$ are provided as one bit inputs to the multiplexer circuit 518 which generates a second output $t_{i2}$ as output bit 1 522 that is provided to the left shift circuit 519. To control the input selection, the multiplexer circuit 518 is connected to receive the first output $t_{i1}$ from the multiplex selection circuit 514 as a selection control signal. In selected embodiments, the multiplexer circuit 518 may be implemented as a simple 1/0 multiplex selection circuit for selecting between the interim outputs $t_{n1}$, $t_{n2}$ in response to the selection control signal $t_{i1}$, though any suitable multiplexing selection circuit may be used. At each clock cycle, the second output $t_{i2}$ from the multiplexer circuit 518 is input to a left shift circuit 519 while the back track state from the memory storage or register 521 is simultaneously input to the right shift circuits 511, 515. At the left shift circuit 519, the second output $t_{i2}$ is shifted to the left by ($S_{LEN}$-2) bits to generate the third input to the combinatorial logic circuit 520 which is also receiving the first and second inputs from the right shift circuit 515 and left shift circuit 516.

With the combinatorial logic circuit 520 be connected and configured to receive and combine the first, second, and third inputs, a predetermined combinatorial logic function (e.g., with a bit-wise OR logic function or an "arithmetic add" function) is applied to effectively concatenate a first output bit $t_{i1}$ selected from the first selected input column TMV1, a second output bit $t_{i2}$ selected from the second selected input column TMV2 in response to the first output bit $t_{i1}$, and $S_{LEN}$-2 bits from back track state 521. As depicted, the first, second, and third inputs to the combinatorial logic circuit 520 each have a specified width $S_{LEN}$, and the output from the combinatorial logic circuit 520 also has the specified width $S_{LEN}$ for storage in the back track state memory storage/register 521. As a result, the trace back computation unit 510 computes two previous back track processing states at each clock cycle by right shifting two bits of the binary state number 521 for logical combination with a first selected bit $t_{i1}$ from the survivor path metric in the first trace back memory column TBM0 502 and a second selected bit $t_{i2}$ from the survivor path metric in the second trace back memory column TBM1. To achieve this, the memory interface to the trace back memory 501 is doubled so that both the first and second trace back memory columns TBM0 502 and TBM1 503 can be retrieved together. In addition, the hardware requirements include three "get bit by index" multiplexer instances 512-514 which are connected to work in parallel, with the first and second input multiplex selection circuits 512, 513 being controlled by an index value of ($S_{LEN}$-1) bits to choose from half trace memory input. As will be appreciated, the "get bit by index" multiplexer instances 512-514 account for the main part of the processing time, and the addition of a one-bit multiplexer circuit 518 adds only a small amount of additional processing time, as compared to sequentially executing a second "get bit by index" multiplexer instance that would conventionally be required to compute the second back track processing state.

With respect to the Viterbi back track computational logic and processing shown in FIG. 5, the operations may be performed with digital hardware by providing three "get bit by index" multiplexer inputs for computing two state metric bits in parallel. However, it will be appreciated that the disclosed concepts may be readily applied to digital Viterbi decoder hardware designs used with digital broadcast standard radio reception to compute additional state metric bits in parallel. For example, four bits can be computed in parallel by using 1+2+4+8=15 "get bit by index" multiplexer instances arranged in parallel processing blocks in combination with any simple multiplexer selection circuit required at each block. For example, there is no multiplexer required to generate the first output $t_{i1}$, a two-way multiplexer required to generate the second output $t_{i2}$, a four-way multiplexer required to generate the third output $t_{i3}$, and an eight-way multiplexer required to generate the fourth output $t_{i4}$. In such instances, the additional "get bit by index" multiplexer hardware may be included in a digital processor as a collection of logic and/or instructions, thereby providing a mechanism for accelerating the processing time requirements for performing parallel back track Viterbi decoding without significantly increasing the hardware complexity or costs. However, it will be appreciated that tradeoffs can be made in terms of latency and complexity. For example, using fewer parallel processing blocks will reduce the circuit size requirements but will increase processing time requirements for performing for back track Viterbi decoding.

As disclosed herein, the disclosed method, system, and apparatus for using fast parallel back track computations in a Viterbi decoder may be implemented as a Viterbi decoder computation engine embodied with dedicated hardware, software, or hybrid implementations that is connected and controlled by control logic and/or computer program product having program code portions for performing steps of a method and/or for performing functions of a device or system which uses elementary operations to perform trace back computations on multiple metric states in parallel by simultaneously computing two possible back track processing results from a second metric state while also computing a first back track processing result from a first metric state which is used to choose between the two possible back track processing results using a simple multiplex selection circuit. Although embodiments are described in the context of processing different metric states with "get bit by index" multiplex selection circuits, the proposed parallel back track computation method, system, and apparatus may be used other suitable multiplex selection circuits to compute 2, 4, 8 or more back track decoding bits in parallel.

As will be appreciated, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

By now it should be appreciated that there has been provided an apparatus, method, program code, and system for performing Viterbi traceback processing on first and second survivor path metrics which may be part of a trellis diagram that is stored in a trace back memory. In the disclosed apparatus, method, program code, and system, a first Viterbi traceback processing operation is performed on a first survivor path metric stored in a trace back memory by selecting, in response to a back track state, a first output data bit for the first survivor path metric. In selected embodiments, the first Viterbi traceback processing operation is performed by supplying the back track state as a selection control signal to a get bit by index multiplexer which selects the first output data bit from the first survivor path metric. In addition, a second Viterbi traceback processing operation is performed on a first half of a second survivor path metric stored in the trace back memory by selecting, in response to a shifted back track state, a first candidate data bit for the second survivor path metric. In selected embodiments, the second Viterbi traceback processing operation is performed by right shifting the back track state by one bit to generate an index selection control signal, and supplying the index selection control signal to a first get bit by index multiplexer which selects the first candidate data bit from the first half of a second survivor path metric. In addition, a third Viterbi traceback processing operation is performed on a second half of the second survivor path metric stored in the trace back memory by selecting, in response to the shifted back track state, a second candidate data bit for the second survivor path metric. In selected embodiments, the third Viterbi traceback processing operation is performed by supplying the index selection control signal to a second get bit by index multiplexer which selects the second candidate data bit from the second half of the second survivor path metric. To select between the first and second data candidate bits, a multiplexer is used which receives the first and second data candidate bits and is controlled by the first output data bit to generate a second output data bit for the second survivor path metric. As disclosed, the second and third Viterbi traceback processing operations are performed in parallel with the first Viterbi traceback processing operation to simultaneously produce the first and second output data bits. In performing the Viterbi traceback processing, a previous back tract state is generated by logically combining the back track state which is right shifted by j bits, the first output data bit which is left shifted by n>j bits, and the second output data bit which is left shifted by m<n bits. In selected embodiments, the step for logically combining includes performing a bit-wise OR combination of the back track state which is right shifted by j bits, the first output data bit which is left shifted by n>j bits, and the second output data bit which is left shifted by m<n bits. In such embodiments, the back track state may have a shift length of SLEN bits, the right shift value j=2, the left shift value n=SLEN-1, and the left shift value m=SLEN-2. In other embodiments, the disclosed apparatus, method, program code, and system may also perform a plurality of Viterbi traceback processing operations on respective portions of a third survivor path metric stored in the trace back memory. As disclosed the plurality of Viterbi traceback processing operations may include selecting, in response to a second shifted back track state, a plurality of candidate data bits for the third survivor path metric, and then selecting between the plurality of candidate data bits with a multiplexer controlled by a combination of the first and second output data bits to generate a third output data bit for the third survivor path metric. In such embodiments, the step for logically combining may include performing a bit-wise OR combination of the back track state which is right shifted by j bits, the first output data bit which is left shifted by n>j bits, the second output data bit which is left shifted by m<n bits, and the third output data bit which is left shifted by k<m bits. For example, the back track state may have a shift length of SLEN bits, the right shift value j=3, the left shift value n=SLEN-1, the left shift value m=SLEN-2, and the left shift value k=SLEN-3.

In another form, there has been provided a Viterbi decoding processor apparatus, method, program code, and system. In the disclosed Viterbi decoding processor, a branch metric unit is connected over an input multiplexer to receive a soft bit data input stream and to generate a plurality of branch metrics. In addition, a path metric unit is connected to receive the plurality of branch metrics and to generate a plurality of survivor path metrics. The disclosed Viterbi decoding processor also includes a trace back memory for storing the plurality of survivor path metrics. In selected embodiments, the plurality of survivor path metrics include first and second survivor path metrics that are part of a trellis diagram stored in the trace back memory. In addition, the disclosed Viterbi decoding processor includes a trace back computation unit connected to the trace back memory and configured to perform a first Viterbi traceback processing operation on a first survivor path metric stored in the trace back memory by selecting, in response to a back track state, a first output data bit for the first survivor path metric. In selected embodiments, the trace back computation unit is configured to perform the first Viterbi traceback processing operation by supplying the back track state as a selection control signal to a get bit by index multiplexer which selects the first output data bit from the first survivor path metric. The disclosed trace back computation unit is also configured to perform a plurality of Viterbi traceback processing operations on respective portions of a second survivor path metric stored in the trace back memory by selecting, in response to a shifted back track state, a plurality of candidate data bits for the second survivor path metric, and to select between the plurality of candidate data bits with a multiplexer controlled by at least the first output data bit to generate a second output data bit for the second survivor path metric. In selected embodiments, the trace back computation unit is configured to perform the plurality of Viterbi traceback processing operations by right shifting the back track state by one bit to generate an index selection control signal; supplying the index selection control signal to a first get bit by index multiplexer which selects the first candidate data bit from the first half of a second survivor path metric; and supplying the index selection control signal to a second get bit by index multiplexer which selects the second candidate data bit from the second half of the second survivor path metric. In other embodiments, the trace back computation unit is configured to perform the plurality of Viterbi traceback processing operations by performing a second Viterbi traceback processing operation on a first half of the second survivor path metric stored in the trace back memory by selecting, in response to a shifted back track state, a first candidate data bit for the second survivor path metric; performing a third Viterbi traceback processing operation on a second half of the second survivor path metric stored in the trace back memory by selecting, in response to the shifted back track state, a second candidate data bit for the second survivor path metric; and selecting between the first and second data candidate bits with the multiplexer controlled by the first output data bit to generate a second output data bit for the second survivor path metric. In addition, the trace back computation unit is configured to logically combine the back track state which is right shifted by j bits, the first output data bit which is left shifted by n>j bits, and the second output data bit which is left shifted by m<n bits to generate a previous back tract state. In selected embodiments, the logical combination processing performed by the trace back computation unit is a bit-wise OR combination of the back track state which is right shifted by j bits, the first output data bit which is left shifted by n>j bits, and the second output data bit which is left shifted by m<n bits. In selected embodiments, the back track state has a shift length of $S_{LEN}$ bits, j=2, n=$S_{LEN}$-1, and m=$S_{LEN}$-2. In other embodiments, the trace back computation unit is further configured to perform Viterbi traceback processing operations on respective portions of a third survivor path metric stored in the trace back memory by selecting, in response to a second shifted back track state, a plurality of candidate data bits for the third survivor path metric, and selecting between the plurality of candidate data bits with a multiplexer controlled by a combination of the first and second output data bits to generate a third output data bit for the third survivor path metric. In such embodiments, the trace back computation unit may be configured to perform a bit-wise OR combination of the back track state which is right shifted by j bits, the first output data bit which is left shifted by n>j bits, the second output data bit which is left shifted by m<n bits, and the third output data bit which is left shifted by k<m bits. As seen from the foregoing, for each further or additional output bit (x), one additional survivor path metric (TBMx) is required and processed with a plurality of Viterbi traceback processing operations. Each xth additional survivor path metric (TBMx) has 2^x portions which are respectively processed by 2^x additional "get by index" operations, with 2^x potential results leading to a 2^x way final multiplexer controlled by a combination of all previous output bits 0 . . . x−1. In this way, the plurality of Viterbi traceback processing operations are performed in parallel with the first Viterbi traceback processing operation to simultaneously produce the first and second output data bits.

In yet another form, there has been provided a wireless communication system which includes a trace back memory and a processor connected for electronic communication on an integrated circuit die. As disclosed, the processor is configured to perform a first Viterbi traceback processing operation on a first survivor path metric stored in the trace back memory in parallel with performing a plurality of Viterbi traceback processing operations on x additional survivor path metrics stored in the trace back memory. In particular, the processor is configured to perform the first Viterbi traceback processing operation on the first survivor path metric by selecting, in response to a back track state having $S_{LEN}$ bits, a first output data bit for the first survivor path metric. In addition, the processor is configured to perform, for each xth additional survivor path metric, 2^x Viterbi traceback processing operations on 2^x respective portions of said xth additional survivor path metric by selecting, in response to an x-bit shifted back track state having $S_{LEN}$ bits, a plurality of 2^x candidate data bits for the xth additional survivor path metric and then selecting, at the processor, between the plurality of 2^x candidate data bits with a multiplexer controlled by at least the first output data bit and any (x−1) additional output data bits to generate an xth additional output data bit for the x additional survivor path metric. The processor is also configured to generate a previous track back state having $S_{LEN}$ bits by logically combining the back track state which is right shifted by x+1 bits, the first output data bit which is left shifted by ($S_{LEN}$-1) bits, and the xth additional output data bit which is left shifted by ($S_{LEN}$-x-1) bits. In this way, the first Viterbi traceback processing operation and plurality of Viterbi traceback processing operations simultaneously produce the first and xth output data bits.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Although the described exemplary embodiments disclosed herein are directed to an exemplary soft bit computation engine, the present invention is not necessarily limited to the example embodiments illustrate herein, and various embodiments of the circuitry and methods disclosed herein may be implemented with other devices and software components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

It should be apparent from the foregoing description that various exemplary embodiments of the invention may be implemented in hardware and/or firmware. Furthermore, various exemplary embodiments may be implemented as instructions stored on a machine-readable storage medium, which may be read and executed by at least one processor to perform the operations described in detail herein. A machine-readable storage medium may include any mechanism for storing information in a form readable by a machine, such as a personal or laptop computer, a server, or other computing device. Thus, a machine-readable storage medium may include read-only memory (ROM), random-access memory (RAM), magnetic disk storage media, optical storage media, flash-memory devices, and similar storage media.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for performing Viterbi traceback processing comprising:

performing a first Viterbi traceback processing operation on a first survivor path metric stored in a trace back memory by selecting, in response to a back track state, a first output data bit for the first survivor path metric;

performing a second Viterbi traceback processing operation on a first half of a second survivor path metric stored in the trace back memory by selecting, in response to a shifted back track state, a first candidate data bit for the second survivor path metric;

performing a third Viterbi traceback processing operation on a second half of the second survivor path metric stored in the trace back memory by selecting, in response to the shifted back track state, a second candidate data bit for the second survivor path metric; and selecting between the first and second data candidate bits with a multiplexer controlled by the first output data bit to generate a second output data bit for the second survivor path metric;

where the second and third Viterbi traceback processing operations are performed in parallel with the first Viterbi traceback processing operation to produce the first and second output data bits.

2. The method of claim 1, wherein the first and second survivor path metrics are part of a trellis diagram stored in the trace back memory.

3. The method of claim 1, where performing the first Viterbi traceback processing operation comprises supplying the back track state as a selection control signal to a get bit by index multiplexer which selects the first output data bit from the first survivor path metric.

4. The method of claim 1, where performing the second Viterbi traceback processing operation comprises:

right shifting the back track state by one bit to generate an index selection control signal; and supplying the index selection control signal to a first get bit by index multiplexer which selects the first candidate data bit from the first half of a second survivor path metric.

5. The method of claim 4, where performing the third Viterbi traceback processing operation comprises supplying the index selection control signal to a second get bit by index multiplexer which selects the second candidate data bit from the second half of the second survivor path metric.

6. The method of claim 1, further comprising generating a previous back track state by logically combining:

the back track state which is right shifted by j bits;

the first output data bit which is left shifted by n>j bits; and the second output data bit which is left shifted by m<n bits;

where j, n, and m are positive integer values.

7. The method of claim 6, where the back track state has a shift length of $S_{LEN}$ bits, j=2, n=$S_{LEN}$-1, and m=$S_{LEN}$-2.

8. The method of claim 1, further comprising:

performing a plurality of Viterbi traceback processing operations on respective portions of a third survivor path metric stored in the trace back memory by selecting, in response to a second shifted back track state, a plurality of candidate data bits for the third survivor path metric; and selecting between the plurality of candidate data bits with a multiplexer controlled by a combination of the first and second output data bits to generate a third output data bit for the third survivor path metric.

9. The method of claim 8, further comprising generating a previous back track state by performing a bit-wise OR combination of the back track state which is right shifted by j bits, the first output data bit which is left shifted by n>j bits, the second output data bit which is left shifted by m<n bits, and the third output data bit which is left shifted by k<m bits.

10. The method of claim 9, where the back track state has a shift length of $S_{LEN}$ bits, j=3, n=$S_{LEN}$-1, m=$S_{LEN}$-2, and k=$S_{LEN}$-3.

11. A Viterbi decoding processor comprising:
a branch metric unit connected over an input multiplexer to receive a soft bit data input stream and to generate a plurality of branch metrics;
a path metric unit connected to receive the plurality of branch metrics and to generate a plurality of survivor path metrics;
a trace back memory for storing the plurality of survivor path metrics; and
a trace back computation unit connected to the trace back memory and configured to:
perform a first Viterbi traceback processing operation on a first survivor path metric stored in the trace back memory by selecting, in response to a back track state, a first output data bit for the first survivor path metric,
perform a plurality of Viterbi traceback processing operations on respective portions of a second survivor path metric stored in the trace back memory by selecting, in response to a shifted back track state, a plurality of candidate data bits for the second survivor path metric, and
select between the plurality of candidate data bits with a multiplexer controlled by at least the first output data bit to generate a second output data bit for the second survivor path metric,
where the plurality of Viterbi traceback processing operations are performed in parallel with the first Viterbi traceback processing operation to produce the first and second output data bits.

12. The Viterbi decoding processor of claim 11, where the trace back computation unit is configured to perform the plurality of Viterbi traceback processing operations by:
performing a second Viterbi traceback processing operation on a first half of the second survivor path metric stored in the trace back memory by selecting, in response to a shifted back track state, a first candidate data bit for the second survivor path metric;
performing a third Viterbi traceback processing operation on a second half of the second survivor path metric stored in the trace back memory by selecting, in response to the shifted back track state, a second candidate data bit for the second survivor path metric; and
selecting between the first and second data candidate bits with the multiplexer controlled by the first output data bit to generate a second output data bit for the second survivor path metric.

13. The Viterbi decoding processor of claim 11, wherein the first and second survivor path metrics are part of a trellis diagram stored in the trace back memory.

14. The Viterbi decoding processor of claim 11, where the trace back computation unit is configured to perform the first Viterbi traceback processing operation by supplying the back track state as a selection control signal to a get bit by index multiplexer which selects the first output data bit from the first survivor path metric.

15. The Viterbi decoding processor of claim 11, where the trace back computation unit is configured to perform the plurality of Viterbi traceback processing operations by:
right shifting the back track state by one bit to generate an index selection control signal;
supplying the index selection control signal to a first get bit by index multiplexer which selects the first candidate data bit from the first half of a second survivor path metric; and
supplying the index selection control signal to a second get bit by index multiplexer which selects the second candidate data bit from the second half of the second survivor path metric.

16. The Viterbi decoding processor of claim 11, where the trace back computation unit is configured to generate a previous back tract state by logically combining:
the back track state which is right shifted by j bits;
the first output data bit which is left shifted by n>j bits; and
the second output data bit which is left shifted by m<n bits to generate a previous back tract state;
where j, n, and m are positive integer values.

17. The Viterbi decoding processor of claim 16, where the back track state has a shift length of $S_{LEN}$ bits, j=2, n=$S_{LEN}$-1, and m=$S_{LEN}$-2.

18. The Viterbi decoding processor of claim 11, where the trace back computation unit is configured to perform Viterbi traceback processing operations on respective portions of a third survivor path metric stored in the trace back memory by:
selecting, in response to a second shifted back track state, a plurality of candidate data bits for the third survivor path metric, and
selecting between the plurality of candidate data bits with a multiplexer controlled by a combination of the first and second output data bits to generate a third output data bit for the third survivor path metric.

19. The Viterbi decoding processor of claim 18, where the trace back computation unit is configured to generate a previous back tract state by performing a bit-wise OR combination of the back track state which is right shifted by j bits, the first output data bit which is left shifted by n>j bits, the second output data bit which is left shifted by m<n bits, and the third output data bit which is left shifted by k<m bits.

20. A wireless communication system, comprising:
a trace back memory and a processor connected for electronic communication on an integrated circuit die, where the processor is configured to perform a first Viterbi traceback processing operation on a first survivor path metric stored in the trace back memory in parallel with performing a plurality of Viterbi traceback processing operations on x additional survivor path metrics stored in the trace back memory by:
performing, at the processor, the first Viterbi traceback processing operation on the first survivor path metric by selecting, in response to a back track state having $S_{LEN}$ bits, a first output data bit for the first survivor path metric;
performing, at the processor, for each xth additional survivor path metric, 2^x Viterbi traceback processing operations on 2^x respective portions of said xth additional survivor path metric by selecting, in response to an x-bit shifted back track state having $S_{LEN}$ bits, a plurality of 2^x candidate data bits for the xth additional survivor path metric and then selecting, at the processor, between the plurality of 2^x candidate data bits with a multiplexer controlled by at least the first output data bit and any x−1 additional output data bits to generate an xth additional output data bit for the x additional survivor path metric; and generating a previous track back state having $S_{LEN}$ bits by logically combining the back track state which is right shifted by x+1 bits, the first output data bit which is left shifted by ($S_{LEN}$-1) bits, and the xth additional output data bit which is left shifted by ($S_{LEN}$-x-1) bits;

where the first Viterbi traceback processing operation and plurality of Viterbi traceback processing operations simultaneously produce the first and xth output data bits.

* * * * *